(12) United States Patent
Leycuras

(10) Patent No.: US 6,402,836 B1
(45) Date of Patent: Jun. 11, 2002

(54) METHOD FOR EPITAXIAL GROWTH ON A SUBSTRATE

(75) Inventor: André Leycuras, Valbonne (FR)

(73) Assignee: CNRS (Centre National de la Recherche Scientifique), Paris (FR)

( * ) Notice: Subject to any disclaimer, the term of this patent is extended or adjusted under 35 U.S.C. 154(b) by 0 days.

(21) Appl. No.: 09/600,904

(22) PCT Filed: Nov. 25, 1999

(86) PCT No.: PCT/FR99/02910

§ 371 (c)(1),
(2), (4) Date: Oct. 25, 2000

(87) PCT Pub. No.: WO00/31322

PCT Pub. Date: Jun. 2, 2000

(30) Foreign Application Priority Data

Nov. 25, 1998 (FR) .............................................. 98 14831
May 7, 1999 (FR) .............................................. 99 05840

(51) Int. Cl.[7] .............................................. C30B 19/12

(52) U.S. Cl. .............................. 117/58; 117/54; 117/63; 117/951; 117/952

(58) Field of Search ................................. 117/952, 951, 117/54, 58, 63

(56) References Cited

U.S. PATENT DOCUMENTS

| | | |
|---|---|---|
| 4,582,561 A | 4/1986 | Ioku et al. |
| 4,614,672 A | 9/1986 | Addamiano |
| 5,108,540 A | 4/1992 | Frijlink |
| 5,298,287 A | 3/1994 | Veltri |
| 5,759,263 A | 6/1998 | Nordell et al. |
| 5,769,942 A | 6/1998 | Maeda |

FOREIGN PATENT DOCUMENTS

| | | |
|---|---|---|
| EP | 0 599 468 A1 | 6/1994 |
| EP | 792 956 A2 | 9/1997 |
| EP | 792 956 A3 | 5/1998 |
| GB | 1139802 | 1/1969 |
| GB | 1 332 348 | 10/1973 |
| JP | 55083226 | 6/1980 |
| JP | 58139424 | 8/1983 |
| JP | 05047674 | 2/1993 |
| JP | 08120451 | 5/1996 |
| WO | WO 89/00212 | 1/1989 |
| WO | WO 96/23912 | 8/1996 |

OTHER PUBLICATIONS

R. M. Potemski, et al., "Gradient Reversal Termination of Liquid Phase Epitaxial Growth", Apr. 1973, pp. 3440–3441, XP–002118352.

W. V. Münch, et al., "*Silicon Carbide Blue–Emitting Diodes Produced by Liquid–Phase Epitaxy*", Mar. 28, 1978, Solid State Electronics vol. 21, No. 9, pp. 1129–1132, XP002001455.

EMCORE Corporation, The Discovery; "*TurboDisc Technology*".

(List continued on next page.)

*Primary Examiner*—Robert Kunemund
(74) *Attorney, Agent, or Firm*—Finnegan, Henderson, Farabow, Garrett & Dunner, L.L.P.

(57) ABSTRACT

The invention concerns a method for epitaxial growth of a material on a first solid material from a material melting on the material, characterized in that it comprises: a step of growth of the first material on the substrate, made of a second material; a step whereby crystalline tips of the first material are made to grow from the contact surface between the first material and the melting material; a step which consists in causing crystals to grow laterally from the crystalline tips in a plane parallel to that of the free surface of the melting material.

15 Claims, 5 Drawing Sheets

OTHER PUBLICATIONS

Thomas Swan Scientific Equipment Division, EPITOR II Reactor.

AIXTRON®, AIX 200/4, MOVPE Reactor with Gas Foil Rotation, AIX 200/4 MOVPE Reactor for Small Scale Production with Gas Foil Rotation, MOVPE Reactor with Gas Foil Rotation & Special Features, (European HQ, Aachen, Germany), (US HQ, Chicago, IL) and (Sales and Service, Tokyo, Japan), Copyright AIXTRON GmbH 1995.

III–Vs. Review, vol. 10 No. 4 (1997).

G. Landgren, et al., "Novel Reactor Design for Large Area Uniformity of Abrupt Hetrojunction Structures", pp. 67–72, Journal of Crystal Growth 77 (1986).

SiC, "A new era: SiC high–frequency electronics".

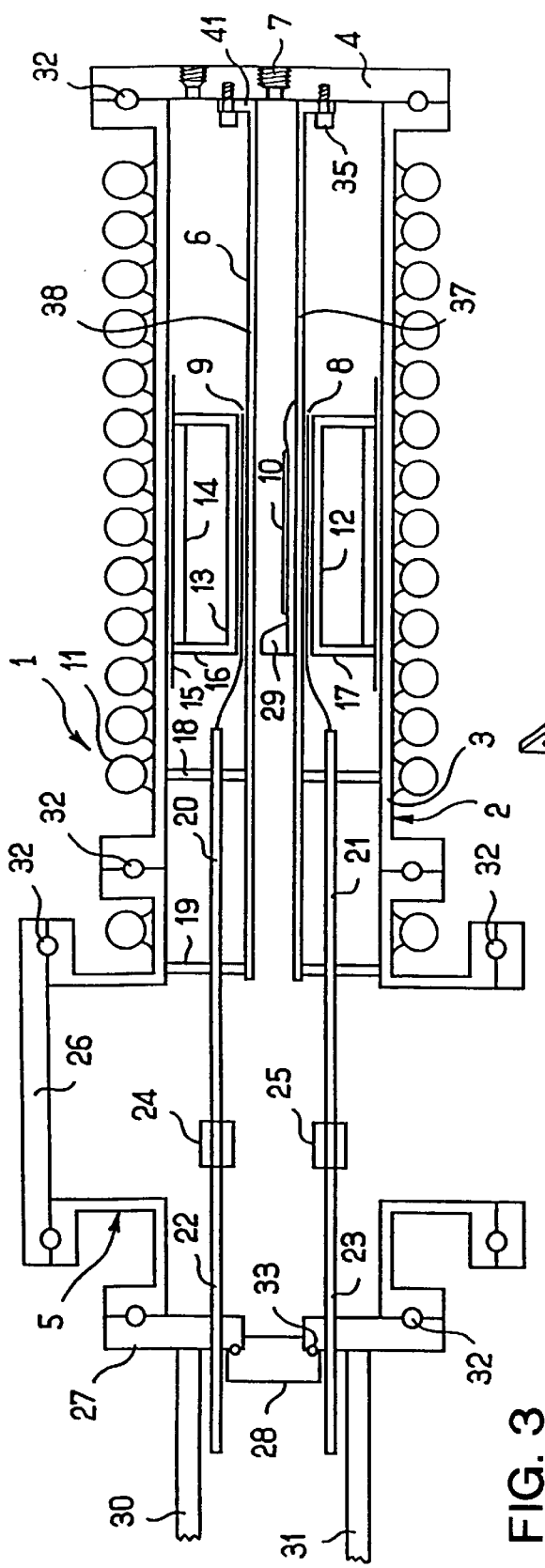
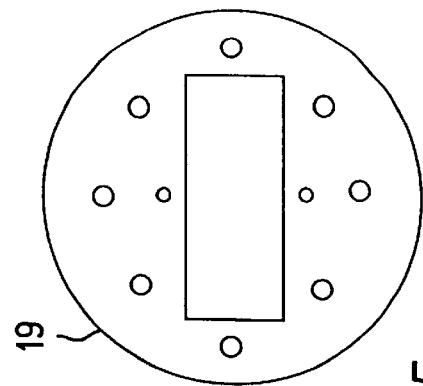
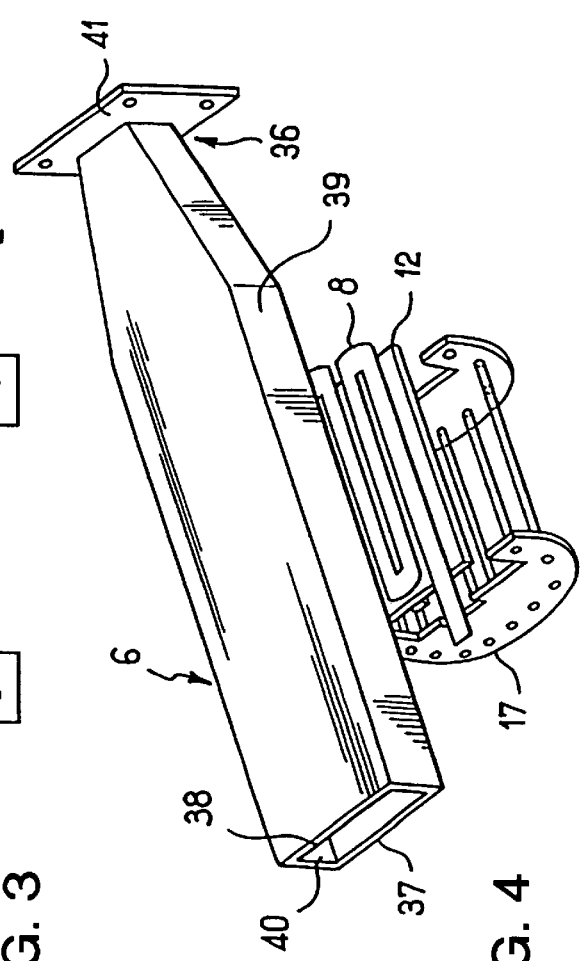
FIG. 3
FIG. 4
FIG. 5

METHOD FOR EPITAXIAL GROWTH ON A SUBSTRATE

The invention relates to the field of processes for thin-film deposition and for crystalline growth of materials on a substrate. The invention also relates to a reactor for implementing this process.

For example, it may be a process for the growth of binary compounds. Certain binary compounds do not exist in the liquid state and large crystals of these compounds, allowing homoepitaxial growth, are not available either. This is especially the case for silicon carbide (SiC) and aluminum nitride (AlN).

For SiC in particular, crystals are obtained by the Acheson method and then these serve as seeds for growing them by the Lely method. The crystals thus obtained are of very good crystalline quality but typically their dimensions are of the order of one centimeter. They are too small for industrial exploitation, a growth method capable of growing them up to 5 to 10 cm is therefore necessary. The so-called modified Lely method is currently the only industrial method for producing SiC as 6H or 4H polytypes. It consists in subliming a particulate SiC filler at 2300° C. and in condensing it on a seed placed above it at 2100° C. It is not without drawbacks, most particularly because of the temperature at which the growth has to be carried out: 2300° C. The equipment for raising to these temperatures is very expensive and the difficulties encountered in order to increase the size of the crystals are very considerable. Moreover, the crystals obtained by this method have microchannels deleterious to the production of large power components.

The crystalline growth of SiC crystals by high-temperature chemical vapor deposition (CVD) and growth in liquid phase give high growth rates but do not make it possible to grow, laterally, i.e. mainly in the plane of the deposition, crystals whose dimensions in this plane are satisfactory.

A "low-temperature" CVD method also exists for the growth of SiC, which makes it possible to grow SiC on silicon substrates of very large dimensions, but the quality of the resulting layers is highly insufficient for the fabrication of electronic components because of the presence of a high density of dislocations due to the crystal lattice mismatch between the layer and the substrate.

The situation in the case of AlN is even less favorable since no supplier of crystals of this material exists.

One objective of the present invention is to provide a process and a reactor making it possible to improve the crystalline quality of crystals obtained by growth from a liquid phase on a substrate.

This objective is achieved by virtue of the process according to the invention, which is a process for the crystalline growth of a material, on a solid first material, from a molten material on the solid first material, characterized in that it comprises:

a step (a) of growing the first material (100) on a substrate (10) consisting of a second material (200), a step (d, d') in which crystalline tips of the first material (100) are grown from the interface between the first material (100) and the molten material, a step (f, f') consisting in growing, laterally, in a plane mainly parallel to that of the free surface of the molten material, crystals from the crystalline tips.

This is because growth via tips allows the generally high dislocation density to be reduced on account of the fact that the first material has itself many dislocations, for example because of a lattice mismatch between the first material and the substrate on which the first material is grown heteroepitaxially, whereas toward the end of the tips, which are in the liquid, on the opposite side from the surface of the first material, stress relaxation occurs, which results in a slight decrease in the number of dislocations, but even for a constant dislocation density, because of the small surface area of each tip, the latter only has a few dislocations.

Advantageously, the process according to the invention comprises a step consisting in reversing the direction of the temperature gradient.

Thus, when these tips have reached about ten micrometers in height, a reversal of the temperature gradient causes lateral growth from the top of these tips. The dislocations, which were very numerous at the surface of the first material, are few in number at the top of the tips and very rare in the crystals which have grown laterally. These crystals are perfectly oriented with respect to one another and coalesce to form a single monocrystal of very high crystalline quality when the thickness becomes sufficiently great. The maximum diameter of the monocrystal is related to the maximum diameter of the starting substrate, for example 300 millimeters in the case of SiC/Si.

The invention also relates to a crystalline growth reactor for implementing the process according to the invention, characterized in that it comprises heating means making it possible to generate a temperature gradient perpendicular to the free surface of the molten material.

This is because the presence of a temperature gradient makes it possible to obtain growth via tips which extends in the direction of the gradient rather than two-dimensional growth parallel to the plane of the first material.

Further benefits, objects and advantages of the invention will appear on reading the detailed description which follows.

The invention will also be more clearly understood by referring to the drawings, in which:

FIG. 3 is a schematic illustration, in longitudinal midsection, of one example of a reactor according to the present invention;

FIG. 4 is an exploded perspective illustration of the arrangement of the first heating means and of the duct, these being used in the construction of the reactor in FIG. 3;

FIG. 5 is a front top view of a component allowing the duct to be held in place inside the chamber of the reactor illustrated in FIG. 3;

Figure 1:
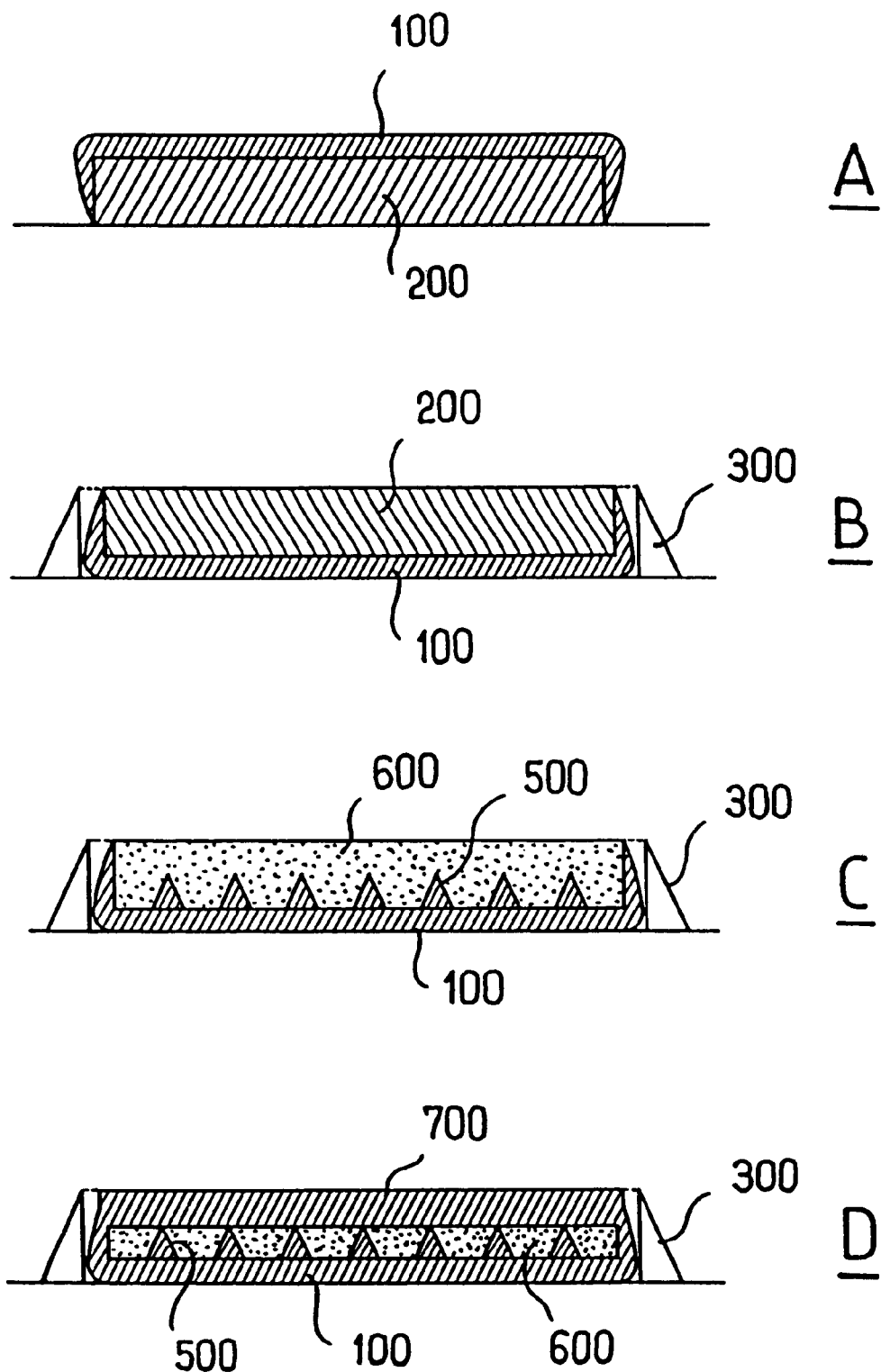
FIG. 1 is a schematic illustration of various steps of one example of how to implement the process according to the invention.

According to a first example of how to implement the process according to the invention, illustrated in FIG. 1, this comprises:

a step (a) of growing a first material 100 on a substrate, consisting of a second material 200 (FIG. 1A);

a step (b) consisting in placing the substrate, with the first material 100 beneath the second material 200, horizontally in a crucible 300 (FIG. 1B);

a step (c) consisting in taking the second material 200 to the melting point, in a stream of high-pressure inert gas, while keeping the first material 100 in the solid state, the second material, then in the molten state, corresponding to the reference 600;

a step (d) consisting in establishing a temperature gradient perpendicular to the free surface of the molten material, so that the interface between the first material 100 and the molten second material 600 is at a higher temperature than the temperature of the free surface of the molten second material 600, and in adding to the stream of inert gas sweeping the surface of the molten second material 600 a precursor gas, at least one first atomic species of which participates, with at least one second atomic participates coming from the molten second material 600, in the growth of a fourth material 500, this growth taking place via tips of the fourth material 500, in crystalline continuity with the first material 100 (FIG. 1C) from the interface between the first material 100 and the molten second material 600;

a step (e) consisting in reversing the direction of the temperature gradient; and a step (f) consisting in growing, laterally, in a plane mainly parallel to the free surface of the molten second material 600, crystals from the growth seeds that the tips constitute (FIG. 1D).

During step (a), a monocrystalline thin layer of the first material 100 is deposited on a substrate of a second material 200 by a conventional deposition method known to those skilled in the art, for example chemical vapor deposition.

In the case of the example described here, the substrate consisting of the second material 200 is monocrystalline silicon and the first material 100 is silicon carbide. The monocrystalline layer of silicon carbide obtained has a high dislocation density because of the mismatch in the crystal parameters between silicon and silicon carbide.

In step (b) the substrate and the layer deposited on top are placed, with the layer under the substrate, horizontally in a special reactor having a controlled vertical temperature gradient and no horizontal gradient. The height of the crucible 300 is such that, during melting of the silicon substrate, the liquid does not spill over the edge of the crucible 300. This condition makes it possible to limit liquid leaks should the vertical edges of the layer of the first material 100 break, this material being both crucible and growth seed.

After the usual operations of starting up the reactor, an inert carrier gas (for example, argon) is introduced into the reactor, preferably at a pressure equal to atmospheric pressure or higher, in order to limit the physical or reactive evaporation of the liquid constituting the molten second material 600, at a flow rate high enough to ensure an almost uniform precursor gas concentration over the entire substrate.

During step (c), the temperature is raised above the melting point of the second material 200, in this case silicon, ensuring that the temperature at the free surface of the molten second material 600 is less than that of the interface between the first material 100 and the molten second material 600.

The thickness of the molten second material 600 above the first material 100 is advantageously of the order of one hundred or a few hundred micrometers, or even several millimeters.

During step (d), a precursor gas (for example, propane in the case of SiC) is mixed with the carrier gas. The precursor gas decomposes at the surface of the molten second material 600 and the first atomic species that it provides, in this case carbon, diffuses to the interface between the crystalline tips and the molten second material 600 (Si) in order to participate in the growth of the fourth material 500, in this case the same as the first material 100, i.e. silicon carbide. The other components of the precursor gas are removed by the carrier gas to the outlet of the reactor.

During step (d), there is growth of the crystalline tips of the fourth material 500 on the layer of the first material 100, in the molten second material 600. The upper limit of the partial pressure of the precursor gas, which must not be reached, is that which would cause the formation of a continuous layer of the fourth material 500 on the surface of the molten second material 600, which would have the effect of instantly stopping any growth. This limiting partial pressure depends on the temperature of the molten second material 600—it is typically 1000 pascals.

Under the conditions defined above, the crystalline tips are separated and distributed fairly uniformly.

Step (e) is started when the crystalline tips have reached a height of approximately 10 micrometers. It consists in reversing the direction of the temperature gradient, i.e. the free surface of the molten second material 600 is raised to a temperature above that of the interface between the molten second material 600 and the first material 100, all the other parameters remaining identical. This causes a lateral growth of the fourth material 500, in this case SiC, from the top of the crystalline tips, which is continued during step (f).

Step (f) is continued until the crystals coalesce into a thick monocrystalline layer.

A complete layer 700 of fourth material (SiC) is finally obtained by the coalescence of all the microcrystals which have grown laterally from the tops of the crystalline tips.

In order to obtain a thicker layer, after the molten second material 600 has been exhausted, it is possible to cool the reactor and carry out a step (g) consisting in putting another charge of the second material 200 on the fourth material 500 in order to continue its growth in thickness. Thus, for the example described here, a charge of silicon is deposited on the layer 700. The growth is then repeated by heating the molten second material 600 and by sweeping its surface as in step (f), i.e. without passing via a new step of forming the crystalline tips.

The typical growth rate of the fourth material 500 thus obtained is several tens of micrometers per hour.

Figure 2:
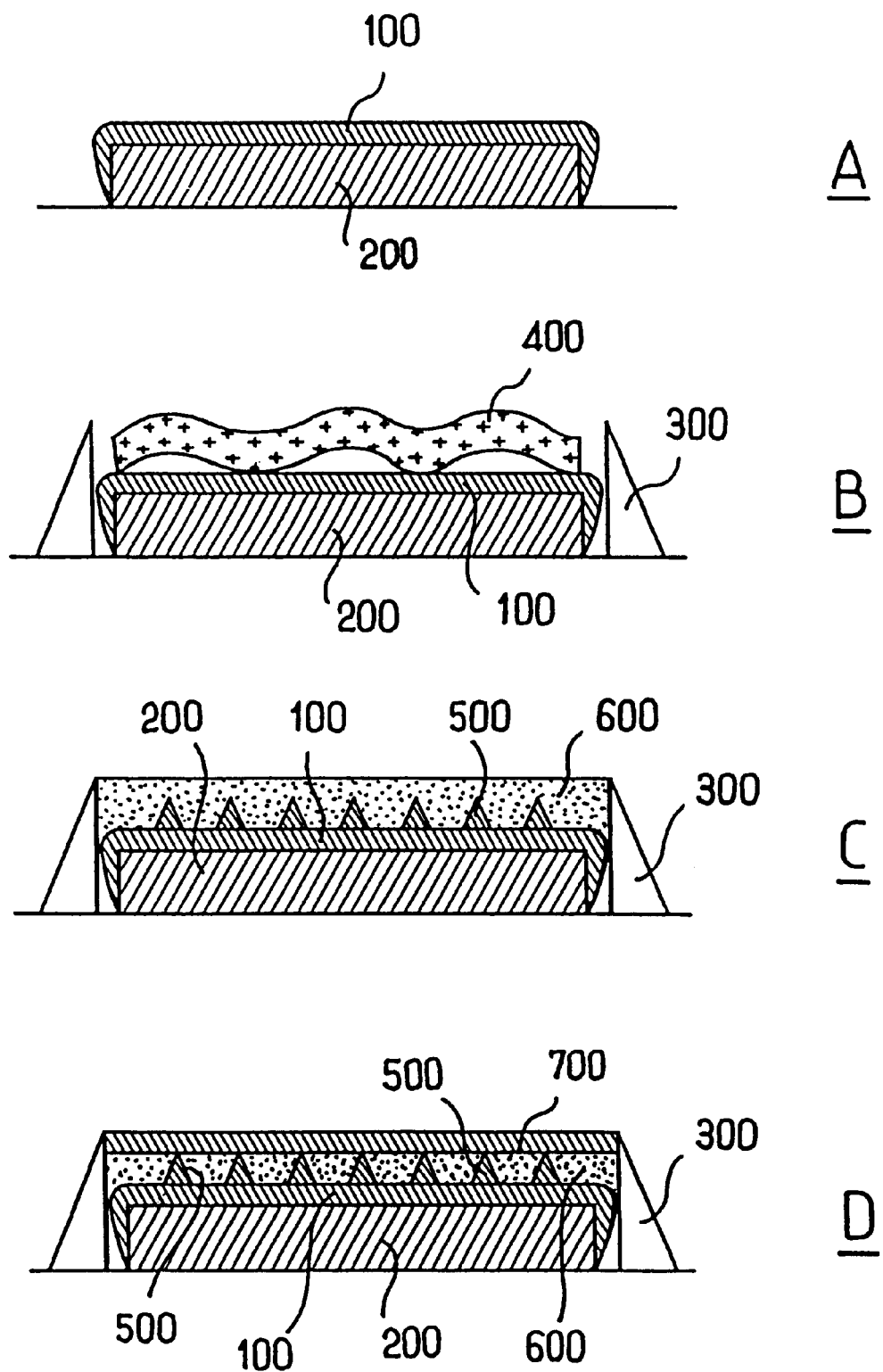
FIG. 2 is a schematic illustration of the various steps of another example of how to implement a process according to the invention.

According to a second example of how to implement the process according to the invention, shown in FIG. 2, this comprises:

a step (a') equivalent to step (a) already described (FIG. 2A);

a step (b') consisting in placing the substrate horizontally in a crucible 300, with the first material 100 above the second material 200 and a third material 400 on the first (FIG. 2B);

a step (c') consisting in melting the third material 400 while keeping the first material 100 and the second material 200 in the solid state; and steps (d'), (e'), (f') and, optionally, (g'), equivalent to steps (d), (e), (f) and (g) described above, respectively.

In the case of the growth of aluminum nitride AlN by the process according to the invention, the first material 100 and the fourth material 500 are aluminum nitride, the second material 200 is sapphire or else silicon carbide and the third material 400 is aluminum (Al).

Thus, aluminum nitride is deposited on sapphire during step (a'). In step (b'), the sapphire substrate is placed in the crucible 300 with the aluminum nitride on top. Aluminum is heated to the liquid state on the aluminum nitride during step (c').

Ammonia or nitrogen are used as precursor gases as a mixture with a carrier gas, in order to deliver the nitrogen, as first atomic species, during step (d'). The rest of the process is equivalent to that already described.

The present invention makes it possible to produce SiC wafers without any microchannels, for example as 3C and 6H polytypes, of large diameters (up to 200 mm and more), at a temperature of 1500° C. instead of 2300° C., in a reactor which is inexpensive in terms of investment and in operating cost.

The process according to the invention, illustrated here with SiC and AlN, may be employed for the growth of other binary compounds, as well as ternary compounds, etc.

A nonlimiting example of a reactor according to the invention is illustrated in FIG. 3. This reactor 1 comprises a chamber 2 consisting of a tube 3, a first closure plate 4, located at one of the ends of this tube 3, and an outlet cross 5 located at the opposite end of the tube 3 with respect to the first closure plate 4. The entire reactor 1 is sealed and can possibly withstand a pressure of a few MPa. The sealing of the reactor 1 is provided by seals 32, 33.

The outlet cross 5 may be replaced by a "T"-shaped element.

The axis of the tube 3 is in the horizontal. Placed inside the tube 3, coaxial with it, is a duct 6. Placed outside the tube 3 are cooling means 11 capable of cooling the tube 3. The tube 3 is advantageously a cylinder made of stainless steel.

The cross 5 is preferably fixed since one of its outlets is connected to the pumping system.

The outlet cross 5 has a lower orifice and an upper orifice, these being radially opposed in the vertical direction. The lower orifice of this outlet cross 5 emerges either on a pump and a pressure regulator for low pressures or on a pressure-release valve for a pressure greater than atmospheric pressure, so as to discharge the gases at constant pressure. These apparatuses are not illustrated in FIG. 3. The upper orifice of the outlet cross 5 is hermetically closed off by a second closure plate 26. The outlet cross 5 also possesses an orifice longitudinally opposed to the tube 3. This orifice may optionally be provided with a rotating passage. In the embodiment presented here, this orifice is closed off by a third closure plate 27 perpendicular to the axis of the tube 3. The third closure plate 27 may optionally be equipped with a window or with a moveable mirror for optical measurements inside the duct 6. This third closure plate 27 includes a hermetically sealed port 28 allowing substrates 10 to be introduced into or extracted from the reactor 1. The third closure plate 27 also includes guides 30, 31. These guides 30, 31 are perpendicular to the plane of the closure plate 27 and are solidly fastened to it. These guides 30, 31 serve for horizontally guiding a manipulator, not illustrated in the figures. The third closure plate 27 also includes passages for first current leads 22, 23. Those parts of the first current leads 22, 23 which are located toward the inside of the chamber 2 are provided with connectors 24, 25.

A duct 6 is positioned and held in place in the tube 3 by virtue of means 35 for fastening a duct 6 to the first closure plate 4. Thus, a duct 6 is held in place so as to be free of any contact with the tube 3. This makes it possible to limit the thermal conduction losses and to avoid thermal stresses.

As illustrated in FIG. 4, the duct 6 is in the form of a tube with a rectangular cross section, having a narrowing 36 at one end of it. This duct 6 comprises two plates for forming lower 37 and upper 38 walls. The lower 37 and upper 38 walls of the duct 6 are horizontal and parallel to the plane of the substrate 10 in the position that it occupies during the deposition. Side walls 39, 40 join the longitudinal edges of the lower 37 and upper 38 walls in order to close the duct 6 longitudinally. That end of the duct 6 which is located on the same side as the narrowing 36 has a square cross section. It is provided with a support plate 41 perpendicular to the longitudinal axis of the duct 6. This support plate 41 has an opening facing the mouth of the duct 6, located on the same side as the narrowing 36. The support plate 41 also has holes in order to allow the duct 6 to be fastened to the first closure plate 4, using the fastening means 35. When the duct 6 is fastened to the first closure plate 4, the mouth of the duct 6, located on the same side as the narrowing 36, and the opening in the support plate 41 lie facing a gas inlet 7. The duct 6 is connected in a sealed manner to the first closure plate 4 at the gas inlet 7. The joint between the duct 6 and the first closure plate 4 is sealed by tightening a graphite seal for example, using the fastening means 35.

The gas inlet 7 serves for supplying the reactor 1 with carrier and precursor gases. The first closure plate 4 is also provided with a gas passage 44 which is offset with respect to the axis of symmetry perpendicular to the plane of the disk formed by the first closure plate 4 and which emerges between the duct 6 and the wall of the tube 3. The gas passage 44 also allows the introduction of gas into the reactor 1. The gas passage 44 allows the flow of a gas which is inert with respect to all of the materials included in the reactor 1 and with respect to the material to be deposited and to the gases flowing in the duct 6, this inert gas preventing any return of the gases resulting from the process toward the heating parts external to the duct 6.

Preferably, the duct 6 is in a material which, all at the same time, is a good heat conductor, is a good electrical insulator, is highly refractory, is chemically very stable and has a low vapor pressure at the operating temperatures, although, optionally, a prior coating of the material intended to be deposited on a substrate 10 in this reactor 1 can be deposited on the internal face of the walls 37, 38, 39, 40 of the duct 6 so as to minimize the diffusion of any outgasing substances during the normal operation of the reactor 1.

Also advantageously, this material has good mechanical strength in order to allow the walls 37, 38, 39, 40 of the duct 6 to have a small thickness. The small thickness of these walls 37, 38, 39, 40 makes it possible to minimize the thermal conduction losses.

The mechanical strength of the material of the duct is also important in being able to support this duct 6 only by its end located on the same side as the narrowing 36 and the support plate 41.

The constituent material of the duct 6 is advantageously boron nitride for use at temperatures of less than 1200° C., or at higher temperatures if the presence of a high nitrogen concentration does not impair the expected quality of the material produced.

For higher temperatures, the duct 6 may be made of graphite. In one case, just as in the other, the duct 6 may be internally lined in the hottest parts with a secondary duct made of a refractory material, for example a refractory metal, which is inert with respect to the gases flowing in the duct 6 and is noncontaminating with respect to the material deposited. The duct 6, whether made of graphite or boron nitride, may be produced either by pyrolitic deposition, or by assembling and/or adhesively bonding the various constituent plates of the walls 37, 38, 39, 40 and the support plate 41. This secondary duct, when there is one, advantageously lines the inside of the duct 6 in a continuous manner, that is to say that, if it consists of plates, these are contiguous and there are no holes in these plates. The secondary duct is, for example, made of tungsten, tantalum, molybdenum, graphite or boron nitride.

By way of example, the thickness of the walls of the duct 6 is less than or equal to approximately 1 mm; the internal height of the duct 6 is preferably less than 30 mm; the width of the duct 6 is equal to the width of a substrate 10 or to the sum of the widths of the substrates 10 which are treated during the same deposition, plus approximately 1 cm between the substrate or substrates 10 and the walls 39 and 40.

That part of the duct 6 corresponding to the narrowing 36 corresponds to about ⅕ of the total length of the duct 6. The length of the part with a constant cross section of the duct 6 is equal to approximately five times the diameter or the length of the largest substrate 10 which it is desired to use or five times the sum of the diameters or lengths of the substrates 10 on which a deposition may be carried out during the same operation. That part of the duct 6 which extends over a length corresponding to the diameter or to the length of a substrate, or to the sum of the lengths or the diameters of the substrates, is called hereafter the deposition zone.

Advantageously, the reactor 1 is provided with first 8 and second 9 heating means placed near the deposition zone and located on either side of the plane of the substrate 10.

Advantageously, these first 8 and second 9 heating means consist of bare resistive elements, i.e. the constituent material of the first 8 and second 9 heating means is in direct contact with the gas flowing between the duct 6 and the tube 3.

Each resistive element corresponding respectively to the first 8 or to the second 9 heating means consists of a band, i.e. a rigid plate element, or of a strip, which is placed flat and parallel to the lower 37 and upper 38 walls of the duct 6 (FIG. 4). This strip or band has a suitable geometry so that, in the deposition zone, the deviations from the mean temperature on that surface of the substrate 10 which is intended for the deposition are minimized. More preferably, these deviations are less than 3° C. Preferably, each resistive element has a dimension in the direction parallel to the width of the duct 6 which is approximately equal to this width. The dimension of each resistive element in the direction parallel to the length of the duct 6 is approximately equal to twice the length of the deposition zone. This in order to optimize the uniformity of the temperature field in the deposition zone. Preferably, each band or strip of a resistive element consists of bands parallel to one another in the longitudinal direction of the tube 3, these bands joining each other in pairs alternately at one or other of their ends so as to form a zigzag geometry. Other geometries can be envisaged, such as spiral geometries.

Each resistive element may have a longitudinal resistance profile, for example obtained by varying its thickness, the profile being suitable for favoring the formation of a controlled temperature profile in the deposition zone.

Each resistive element has a high filling coefficient in the deposition zone so that their temperature remains as little as possible above the desired local temperature.

The space between the bands of the resistive elements is sufficient to avoid an arc or a short circuit, but is also small enough to maintain acceptable homogeneity in the temperature field and for it not to be necessary for its temperature to be much higher than that of the duct which is itself that at which the deposition takes place. Preferably, the first 8 and second 9 heating means are supplied with a voltage of less than or equal to 240 volts and more preferably still of less than or equal to 100, 110 or 120 volts.

Optionally, the first heating means 8 and second heating means 9 each consist of several resistive elements of the type of those described above.

Advantageously, the resistive elements are made in an electrically conducting and refractory material having a very low vapor pressure at the operating temperatures. This material may, for example, be graphite, a metal such as tantalum or tungsten, or else a refractory alloy, etc. Preferably, it is high-purity graphite.

The first 8 and second 9 heating means are supplied with current independently of each other so as to be able to be raised to different temperatures. It is also possible to generate a temperature gradient perpendicular to the plane of the substrate 10. This gradient may have a positive, negative or zero value, by independently controlling the electrical power applied to one of the first 8 or second 9 heating means.

The first 8 or second 9 heating means may be applied, outside the duct 6, in the region of the deposition zone, so that they are in contact with the lower 37 and upper 38 walls, respectively. However, according to a variant, these means are each positioned, outside the duct 6, so as to be a distance of 1 to 3 mm from one of the lower 37 or upper 38 walls, respectively. The first 8 and second 9 heating means are each pressed against the lower 37 and upper 38 walls by retention plates 12, 13 which are electrically insulating and thermally conducting. If the duct 6 is not an electrically insulating material, it is necessary to put, between the duct 6 and the first 8 and second 9 heating means, an electrically insulating intermediate material in order to avoid any electrical contact, especially in the hot zone, if very high temperatures have to be achieved.

These retention plates 12, 13 may be made of boron nitride and have a thickness of approximately 1 mm, or even less. It is also particularly advantageous to confine the retention plates 12, 13 to the coolest ends of the elements of the duct 6 so as to prevent decomposition of the boron nitride and formation of nitrogen. Boron nitride sheaths designed to house thermocouples 51 may be cemented to the retention plates 12, 13, but they may also be free above the first 8 and second 9 heating means. These thermocouples 51 (not shown in FIGS. 3 to 5) are used for measuring the temperature of the duct 6, to regulate it and to control the homogeneity of the duct in the deposition zone. They can be used for temperatures of less than 1700° C. (for temperatures greater than 1700° C., the temperature must be measured by optical pyrometry or by thermocouples without any contacts). The hot junction of these thermocouples 51 is located outside the duct 6 as close as possible to the first 8 and second 9 heating means.

When the duct 6 is made of graphite, that is to say when it is conducting, the first 8 and second 9 heating means may be made of rigid graphite. They are then electrically isolated from the duct 6 by spacers, for example made of boron nitride, which separate them from the duct 6 by a few millimeters. These spacers may be fastened to the ends of the first 8 and second 9 heating means and therefore may not be heated excessively. One or more sheaths, made of graphite or of boron nitride, may be fastened to the faces of the duct 6 in order to house thermocouples which are themselves insulated in refractory and electrically insulating sheaths.

As shown in FIG. 4, the first 8 and second 9 heating means, as well as the retention plates 12, 13, are held together against the duct 6 by means of cradles 16, 17. Each cradle 16, 17 consists of two half-disks which are parallel to each other and connected together by rods which are perpendicular to them. The diameter of the disks, consisting of two half-disks, is slightly less than the internal diameter of the tube 3. The straight edge of the two half-disks is in a horizontal plane. Each straight edge of each half-disk includes notches capable of receiving a retention plate 12 or 13, the first 8 or second 9 heating means as well as half the height of the duct 6. The resistive elements of the first 8 and second 9 heating means are kept isolated from the duct 6 by the cradles 16, 17.

The dimension of these cradles 16, 17 in the direction parallel to the longitudinal axis of the duct 6 corresponds approximately to the length of the first 8 or second 9 heating means in that direction.

These cradles 16, 17 are placed approximately in the middle of the duct 6, considered along its longitudinal direction.

Advantageously, the half-disks of the cradles 16, 17 are in contact with the duct 6 in the cool parts of the latter.

Heat shields 14, 15 are placed on either side of the first 8 and second 9 heating means, outside the latter. More specifically, heat shields 15 are located between the internal wall of the tube 3 and the curvilinear part of the half-disks making up the cradles 16, 17. They extend below the internal face of the tube 3, but without contacting the latter, concentrically around the heating zone. Other heat shields 14 are placed between the retention plates 12, 13 and the previous heat shields 15. These heat shields 14, 15 are composed of two or three thin sheets of polished, reflecting and refractory metal such as tantalum, molybdenum, etc. The outermost heat shield 14 or 15 is at the closest point a few millimeters from the internal wall of the tube 3. This longitudinal configuration, with the first 8 and second 19 heating means inside the tube 3, in contact with the duct 6, and two or three heat shields 14, 15, greatly limits the radiation losses which would otherwise be very considerable at high temperatures, such as those required for the deposition of silicon carbide.

The half-disks of the cradles 16, 17 are made in an electrically and thermally insulating material. Thus, the heat shields 14, 15 are electrically and thermally insulated from each other and from the heating means 8, 9.

The assembly consisting of the duct 6, the first 8 and second 9 heating means, the retention plates 12, 13, the cradles 16, 17 which hold all these elements together, together with the heat shields 14, 15, is placed in the tube 3. This assembly limits the flow of gas outside the hot part of the duct and thus helps to limit the heat losses.

Advantageously, two disks 18, 19 are placed, perpendicular to the axis of the tube 3, between the cradles 16, 17 and the outlet cross 5.

As shown in FIG. 5, these disks 18, 19 are provided with a rectangular central opening, the area of which corresponds approximately to the cross section of the duct 6, so as to be able to slip these disks 18, 19 onto this duct 6. These disks 18, 19 also have holes peripherals to the central opening and intended for passage of second current leads 20, 21 and thermocouple wires 51. One 19 of these disks 18, 19 is placed in the outlet cross 5. The other 18 of these disks 18, 19 is placed between the disk 19 and the cradles 16, 17. The purpose of these disks 18, 19 is to hold together the duct 6, the second current leads 20, 21 and the wires of the thermocouples 51, as well as to limit the gas exchange between the inside of the duct 6 and the space lying between the duct 6 and the tube 3. However, the disks 18, 19 must allow passage of the gases coming from the outlet of the duct 6, between the internal space of the duct 6 and the space lying between the duct 6 and the tube 3, so that the pressure is balanced on either side of the walls 37, 38, 39, 40. By thus balancing the pressure on either side of the walls 37, 38, 39, 40, it is possible to make the latter with a small thickness.

The pairs of second current leads 20, 21 are connected to the first current leads 22, 23 by means of connectors 24, 25. The thermocouples 51 are also connected to the outside of the chamber 2 via connectors located in the chamber 2.

The disks 18, 19 may be made of an electrically and thermally insulating, but not necessarily highly refractory material.

The hermetically sealed port 28 covers an opening whose width is approximately equal to that of the duct. This opening is located on the axis of the duct 6. It allows the substrates 10 to be inserted and removed. An inlet airlock is possibly connected to the third closure plate 27 in order to prevent, during the operations of inserting and removing the substrates 10, from venting the reactor 1 to atmosphere again.

The substrates 10 are advantageously inserted into the reactor 1 by means of a substrate holder 29. Advantageously, the substrate holder 29 is made of a material which is a good thermal conductor so that it has little thermal inertia. Preferably, this substrate holder 29 is made of boron nitride, but it may also be made of graphite for example. The substrate holder 29 is inserted into the reactor 1 by a gripper manipulator which slides along the guides 30, 31. This manipulator consists of a thin rigid tube coaxial with the axis of the duct 6, of a long rod threaded on the inside of this tube and fastened, on the reactor 1 side, to two symmetrical gripper elements which are hinged about a vertical hinge, the outer end of the threaded rod being screwed by a freely rotating captive nut. By screwing the nut, the threaded rod retracts and the gripper is thermally clamped onto a vertical part of the substrate holder 29. The manipulator can then be moved along the guides 30, 31 in order to insert or remove the substrate holder 29. A cam on the manipulator may be provided in order to allow the gripper to be raised, when the latter has just seized the substrate holder 29, in its position inside the duct 6, so that the latter does not rub against the internal face of the wall 37.

Before commissioning the reactor 1, a coating of the predominant product to which the reactor 1 is dedicated is deposited in the duct 6, with neither the substrate 10 nor the substrate holder 29, after a thorough degassing step, at a temperature greater than the usual deposition temperature, and a thorough purge with the carrier gas. This step may be followed by a similar deposition on the substrate carrier 29, without the substrate 10. The reactor is then ready to be used.

Variants of the process and the reactor according to the invention are possible.

In another embodiment of the reactor (FIG. 6), the current leads 22, 23 and the thermocouple outputs may advantageously be located on the same side as the gas inlet 7. The loading and unloading of the substrates 10 may then be accomplished by disconnecting the body of the reactor 3 from the cross 5. It is then advantageous to install a rotary substrate holder 29 actuated via a sealed rotary passage and driven so as to pass axially through the closure plate 27. This arrangement is particularly useful in steps (a) and (a') of the processes described above.

Resistive first 8 and second 9 heating means were described above. This type of heating means makes it possible to reach temperatures greater than 1750° C. with a low investment in terms of materials and a lower energy consumption than with the processes and the reactors of the prior art.

For example, in order to reach the melting point (1410° C.) of a silicon wafer 50 mm in diameter, in a stream of hydrogen of 8 liters per minute, at a pressure of $5 \times 10^3$ pascals, a power of 3 kW is sufficient. Likewise, in this environment, in order to raise the temperature from 500° C. to 1400° C., at a rate of 100° C. per second, a 7 kW power line is also sufficient.

However, other types of heating means 8, 9 may be envisaged, even if they seem less advantageous, such as induction heating means, heating means in which the first 8 and second 9 heating means form only a single device placed all around the duct 6, etc.

Figure 6:
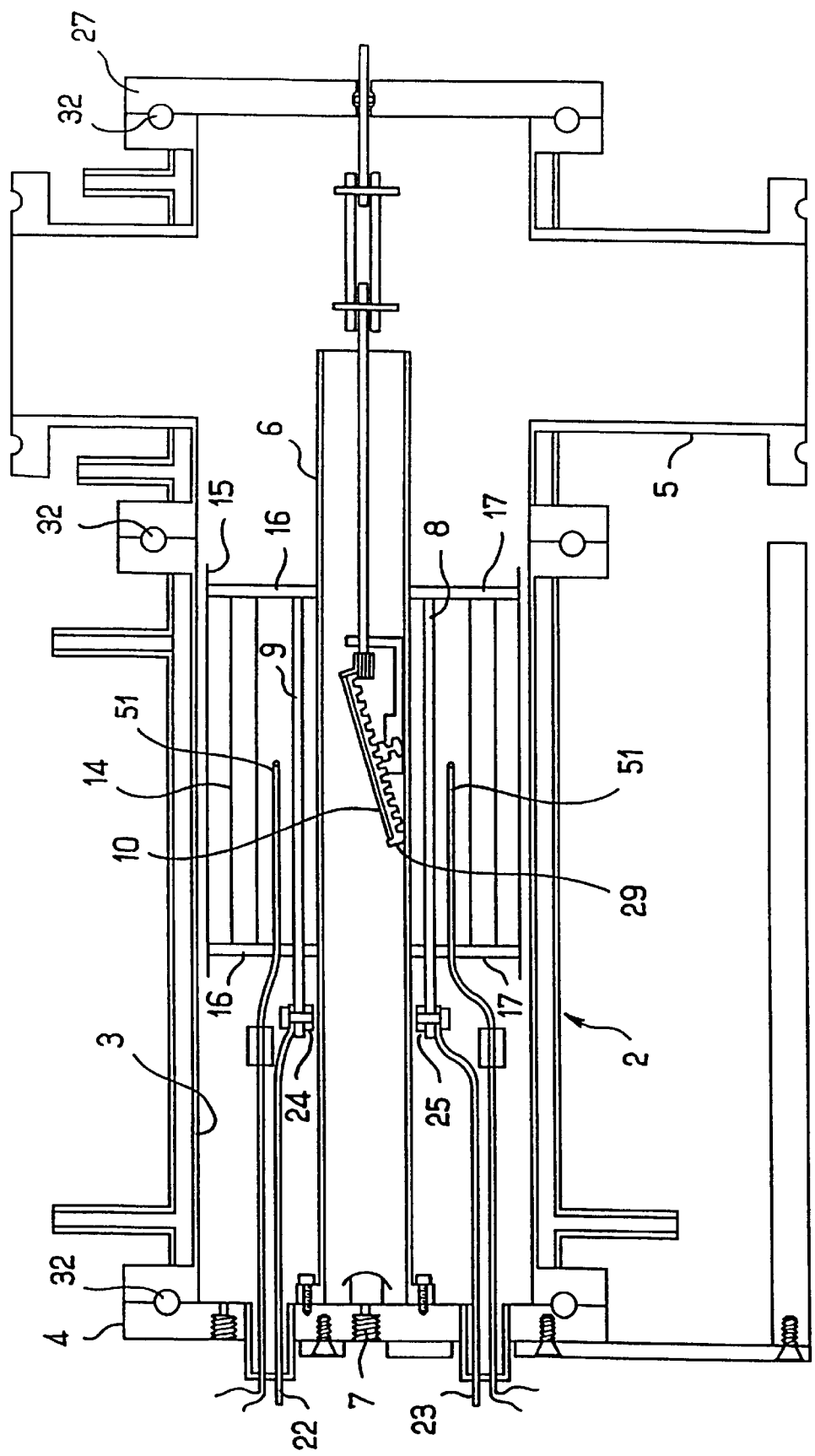
FIG. 6 is a schematic illustration, in longitudinal midsection of another example of a reactor according to the present invention.

FIG. 6 shows another embodiment of the reactor 1 according to the invention. In this embodiment, the reactor 1 comprises a chamber 2 consisting of two concentric stainless steel tubes 3, 103, the common axis of revolution of which is horizontal. A coolant flows in the space between the two walls of these tubes 3, 103.

An antisplash nozzle 50 is mounted on the axis of the gas inlet 7 so as to be conducive to achieving good gas velocity uniformity. The gas passage 44 may also optionally be provided with an antisplash nozzle.

A mechanism 60, driven by a shaft 61 which passes through a gastight penetration 62, and a sliding coupling 63, allows the substrate 10 to be rotated so as to ensure greater uniformity of the deposition.

All the electrical and fluid connections to the third closure plate 27 and the first closure plate 4 are sufficiently long and flexible to be able to move them over approximately twice the length of the duct 6. Advantageously, the connections may also be made only to the first closure plate 4.

The first closure plate 4 is fastened to a carriage comprising a vertical support 64 and a horizontal support 65.

The horizontal support 65 may be moved parallel to the axis of the tube 3 over a running track, not shown. In order to mount the assembly comprising the duct 6 and its equipment, the first closure plate 4 is opened, the tube 3 remaining fastened to the cross 5.

To load or unload a substrate 10 there is the choice between opening the third closure plate 27 or separating the tube 3 from the cross 5.

The substrates 10 are inserted and held in place in the deposition zone by a graphite substrate holder 29 which may be raised a few degrees, on the downstream side with respect to the gas flow, so as to offer a greater area of projection on a vertical plane, in the duct 6. The substrate holder consists, for example, of a disk with a rim. Advantageously, the rim has a height greater than the height of the substrate 10. The substrate holder 29 can rotate the substrate 10 which it supports, so as to ensure better deposition uniformity. Advantageously, this is achieved by virtue of a mechanical transmission consisting of a bevel gear having a horizontal axis and fastened to the shaft 61, the latter being rotated by a motor external to the reactor 1, at a variable speed, providing a substrate rotation speed possibly ranging up to 10 revolutions per second.

According to an advantageous variant, not shown, of the reactor according to the present invention, the reactor has first 8 and second heating means which are offset one with respect to the other in the longitudinal direction of the duct 6. This also makes it possible for the temperature distribution to be made uniform over the entire surface area of the substrate, favoring the formation of a plateau in the longitudinal temperature profile.

According to another advantageous variant, the center of the substrate 10 on the substrate holder 29 is shifted toward the downstream direction of the gas flow, in the zone of the first 8 and second 9 heating means, without nevertheless the substrate 10 leaving this zone.

Figure 7:
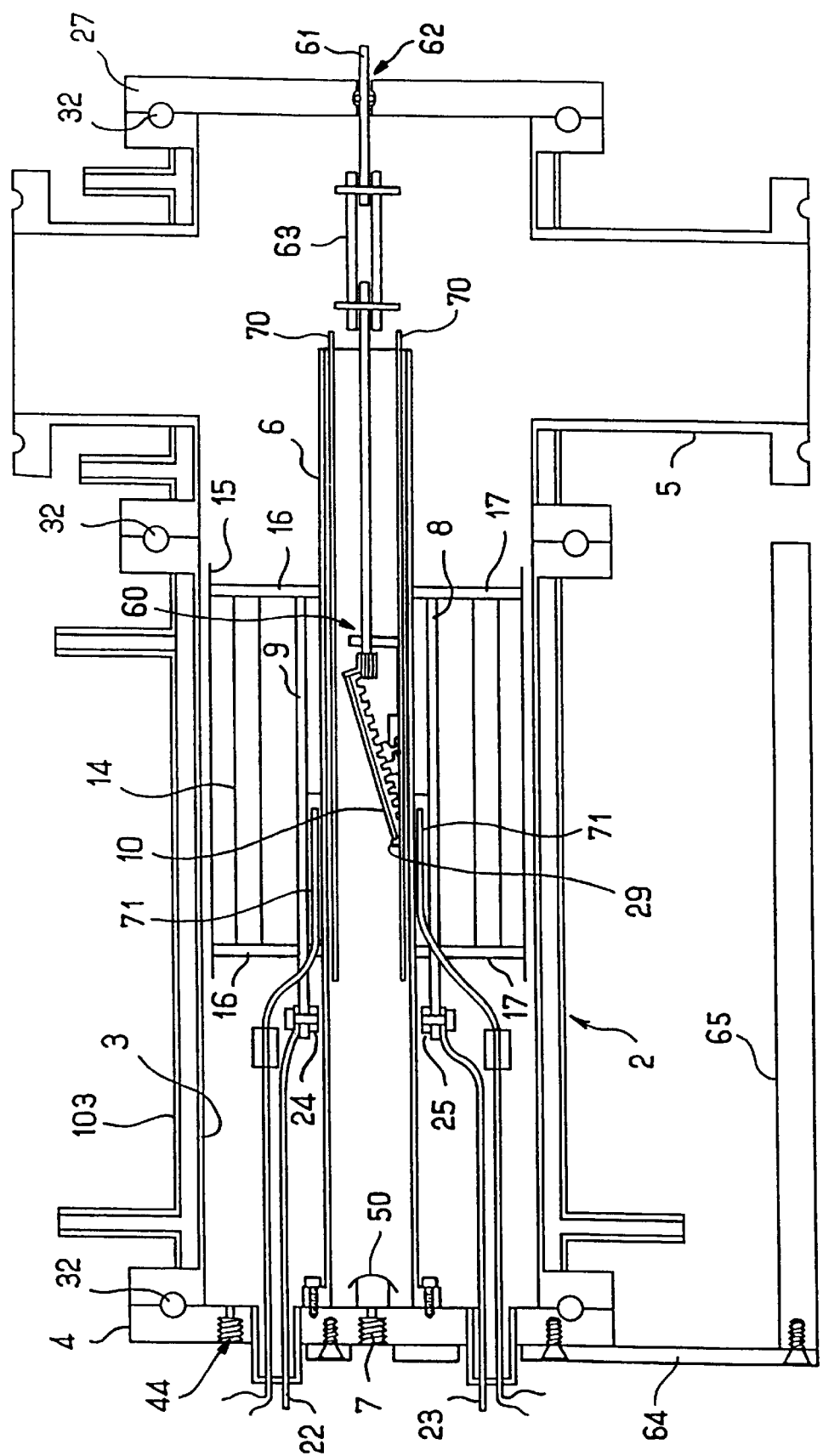
FIG. 7 is a schematic illustration, in longitudinal midsection, of yet another example of a reactor according to the present invention.

According to yet another variant, illustrated in FIG. 7, the secondary duct consists of removable plates 70 which may be easily inserted and removed by sliding in grooves, not shown, in the duct 6. These plates 70 are useful for protecting the duct 6 from the deposition away from the substrate(s) 10. They are easily maintained and advantageously made of graphite, boron nitride or another refractory material compatible with the temperature of the process and with the ambient medium.

According to another advantageous variant, also shown in FIG. 7, the temperature may be measured by optical pyrometer fibers 71 located in sheaths fastened to the duct 6 and between the duct 6 and the first 8 and second 9 heating means, rather than by thermocouples 51, so as to increase the lifetime of the means for measuring the temperature.

The process according to the invention makes it possible to achieve the aforementioned advantages while maintaining a level of impurities in the layers obtained which is equivalent to those of the layers obtained by means of the processes and the reactors of the prior art.

A process and a reactor according to the invention are particularly well suited to the growth of silicon carbide or aluminum nitride layers on substrates 10.

What is claimed is:

1. A process for growing crystals of a molten material on a solid first material comprising:
   growing the first material on a substrate consisting of a second material,
   melting the second material, thereby forming the molten material, while keeping the first material in a solid state, or melting a third material, thereby forming the molten material, while keeping the first material and second material in a solid state,
   growing crystalline tips of the first material from an interface between the first material and the molten material, and
   growing, laterally, in a plane mainly parallel to that of the free surface of the molten material, crystals from the crystalline tips.

2. The process according to claim 1, further comprising imposing a temperature gradient in a direction perpendicular to the free surface of the molten material.

3. The process according to claim 2, further comprising reversing the sign of the gradient after the tips have grown to a desired height.

4. The process according to claim 1, further comprising placing the substrate, with the first material beneath the second material, horizontally in a crucible, before melting the second material.

5. The process according to claim 1, further comprising placing the substrate horizontally in a crucible, with the first material above the second material and a third material above the first material.

6. The process according to claim 1, further comprising sweeping the molten material with a precursor gas, wherein at least one first atomic species of the gas participates with at least one second atomic species from the molten material in the growth of crystalline tips of a fourth material in crystalline continuity with the first material, wherein the crystalline tips of the fourth material are grown when the interface between the first material and the molten material is at a higher temperature then the temperature of the free surface of the molten material.

7. The process according to claim 6, wherein the fourth material is a binary compound.

8. The process according to claim 7, wherein the binary compound is silicon carbide.

9. The process according to claim 7, wherein the binary compound is aluminum nitride.

10. The process according to claim 1, wherein the growing of the crystals laterally from the crystalline tips, is carried out by reversing the sign of a temperature gradient.

11. The process according to claim 6, further comprising placing a charge of the second material or of the third material on the fourth material in order to continue its growth in thickness.

12. The process according to claim 1, wherein the growing of the first material on a substrate is carried out by chemical vapor deposition.

13. The process according to claim 6, wherein the growth of the fourth material, which is in crystalline continuity with the first material, proceeds from the crystalline tips situated at the interface between the first material and the molten material.

14. The process according to claim 1, wherein the temperature gradient is reversed when the crystalline tips have reached a height of approximately 10 micrometers.

15. The process according to claim 3, wherein the growing of the crystals from the crystalline tips laterally occurs after the reversal of the temperature gradient.

* * * * *

UNITED STATES PATENT AND TRADEMARK OFFICE
CERTIFICATE OF CORRECTION

PATENT NO. : 6,402,836 B1
DATED : June 11, 2002
INVENTOR(S) : André Leycuras

It is certified that error appears in the above-identified patent and that said Letters Patent is hereby corrected as shown below:

<u>Title page,</u>
Item [57], ABSTRACT,
Line 3, before "material", insert -- first --.
Line 4, "the substrate" should read -- a substrate --.

<u>Column 12,</u>
Line 64, "then the" should read -- than the --.

<u>Column 14,</u>
Line 6, "claim 1" should read -- claim 3 --.

Signed and Sealed this

Twenty-second Day of October, 2002

Attest:

JAMES E. ROGAN
Attesting Officer          Director of the United States Patent and Trademark Office